(12) United States Patent
Gmeilbauer et al.

(10) Patent No.: US 9,988,739 B2
(45) Date of Patent: Jun. 5, 2018

(54) METHOD FOR PULLING A SINGLE CRYSTAL COMPOSED OF SILICON FROM A MELT CONTAINED IN A CRUCIBLE, AND SINGLE CRYSTAL PRODUCED THEREBY

(75) Inventors: Erich Gmeilbauer, St. Pantaleon (AT); Robert Vorbuchner, Burghausen (DE); Martin Weber, Kastl (DE)

(73) Assignee: SILTRONIC AG, Munich (DE)

( * ) Notice: Subject to any disclaimer, the term of this patent is extended or adjusted under 35 U.S.C. 154(b) by 2061 days.

(21) Appl. No.: 13/014,804

(22) Filed: Jan. 27, 2011

(65) Prior Publication Data

US 2011/0195251 A1     Aug. 11, 2011

(30) Foreign Application Priority Data

Feb. 10, 2010   (DE) ........................ 10 2010 007 460

(51) Int. Cl.
  *C30B 29/06*   (2006.01)
  *C30B 15/00*   (2006.01)
  *C30B 29/66*   (2006.01)
  *C30B 15/14*   (2006.01)

(52) U.S. Cl.
  CPC .............. *C30B 29/06* (2013.01); *C30B 15/14* (2013.01); *Y10T 428/298* (2015.01)

(58) Field of Classification Search
  CPC .......... D02G 3/00; C30B 15/00; C30B 29/06; C30B 29/66
  See application file for complete search history.

(56) References Cited

U.S. PATENT DOCUMENTS

| | | |
|---|---|---|
| 5,476,065 A | 12/1995 | Ikezawa et al. |
| 5,902,394 A | 5/1999 | Burkhart et al. |
| 6,036,776 A | 3/2000 | Kotooka et al. |
| 6,086,671 A | 7/2000 | Kawanishi et al. |
| 6,228,164 B1 | 5/2001 | Ammon et al. |
| 6,340,390 B1 | 1/2002 | Asano et al. |
| 2002/0084451 A1* | 7/2002 | Mohr et al. ....................... 257/1 |
| 2002/0121238 A1 | 9/2002 | Falster et al. |

(Continued)

FOREIGN PATENT DOCUMENTS

| | | |
|---|---|---|
| CN | 1489643 A | 4/2004 |
| CN | 101024894 A | 8/2007 |

(Continued)

OTHER PUBLICATIONS (Semi, Conversion of Units for Impurity Concentrations in Silicon) 2011.*

*Primary Examiner* — Jennifer Chriss
*Assistant Examiner* — Ricardo Lopez
(74) *Attorney, Agent, or Firm* — Brooks Kushman P.C.

(57) ABSTRACT

Silicon single crystals are pulled from a melt in a crucible, the single crystal surrounded by a heat shield, the lower end of which is a distance h from the melt surface, wherein gas flows downward between the single crystal and the heat shield, outward between the lower end of the heat shield and the melt, and then upward in the region outside the heat shield. The internal diameter of the heat shield at its lower end is 55 mm or more than the diameter of the single crystal, and the radial width of the heat shield at its lower end is not more than 20% of the diameter of the single crystal. Highly doped single crystals pulled accordingly have a void concentration $\leq 50$ m$^{-3}$.

1 Claim, 1 Drawing Sheet

(56) References Cited

U.S. PATENT DOCUMENTS

| | | |
|---|---|---|
| 2003/0061985 A1* | 4/2003 | Kulkarni et al. ............... 117/19 |
| 2007/0089666 A1 | 4/2007 | Koike |
| 2007/0163485 A1 | 7/2007 | Fabry et al. |
| 2008/0011222 A1 | 1/2008 | Shimomura et al. |
| 2008/0187736 A1 | 8/2008 | Sattler et al. |

FOREIGN PATENT DOCUMENTS

| | | |
|---|---|---|
| CN | 101302646 A | 11/2008 |
| DE | 100 40 970 B4 | 7/2008 |
| DE | 10 2007 023 040 A1 | 11/2008 |
| EP | 0 756 024 A2 | 1/1997 |
| JP | 5-43380 A | 2/1993 |
| JP | 6-219886 A | 8/1994 |
| JP | 11-92272 A | 4/1999 |
| JP | 2001261493 A1 | 9/2001 |
| JP | 2007210803 A | 8/2007 |
| JP | 2008162865 A | 7/2008 |

\* cited by examiner

METHOD FOR PULLING A SINGLE CRYSTAL COMPOSED OF SILICON FROM A MELT CONTAINED IN A CRUCIBLE, AND SINGLE CRYSTAL PRODUCED THEREBY

CROSS-REFERENCE TO RELATED APPLICATION

This application claims priority to German Patent Application No. 10 2010 007 460.8 filed Feb. 10, 2010 which is herein incorporated by reference.

BACKGROUND OF THE INVENTION

1. Field of the Invention

The invention relates to a method for pulling a single crystal composed of silicon from a melt contained in a crucible, wherein the single crystal, during pulling, is surrounded by a heat shield, the lower end of which is at a distance h from the surface of the melt, wherein a gas flows downward in the region between the single crystal and the heat shield, outward between the lower end of the heat shield and the silicon melt and then upward again in the region outside the heat shield. The invention also relates to a single crystal which can be produced by the method.

2. Background Art

It is known that the Czochalski method of growing single crystals is a very sensitive process and crystal structural defects in the form of dislocations and atomic point defects can occur. In addition, the occurrence of macroscopic voids is observed, the latter being bubble-type holes having diameters of a few micrometers up to millimeters. These should not be confused with COPs ("crystal originated particles"), which are formed from agglomerated atomic vacancies and which have a diameter of up to a few hundred nanometers.

The incorporation of voids into the growing single crystal does not inevitably lead to the formation of dislocations and therefore generally remains undetected during the crystal pulling process. It is only when the single crystal is subsequently sliced into wafers that the voids included therein can be detected by a visual inspection. In general, only relatively few silicon wafers (in the per mille range) are affected which are rejected by the visual inspection. However, frequent occurrence is observed in the case of specific important production processes, e.g. in the case of highly doped crystals. Moreover, it is difficult to detect small voids with hundred percent certainty. There is the risk of voids within the silicon wafer remaining undiscovered during the visual inspection. For component-manufacturing customers, however, it is of crucial importance to acquire only wafers which have no voids of this type. The uncontrolled occurrence of macroscopic voids can lead to huge economic losses. It is therefore desirable and necessary to find solutions which significantly reduce or even completely prevent the harmful voids.

In EP756024A2 it is emphasized that it is advantageous initially to melt fragments composed of silicon, rather than silicon granules, because the latter, on account of a high hydrogen content, tend to form bubbles which can ultimately be incorporated into the single crystal.

U.S. Pat. No. 5,902,394 describes a method which is intended to drive the gas bubbles out of the melt prior to crystal growth and substantially consists of varying the rotational speed of the crucible.

In U.S. Pat. No. 6,086,671 gas bubbles in the melt are mentioned as a cause of dislocations. They can be suppressed by a static magnetic field being applied as early as during the melting of the polycrystalline material.

DE 102007023040A1 describes a pulling method in which the melt is degassed prior to the attachment of the seed crystal by increasing the temperature and applying a static magnetic field. The duration of this degassing phase is up to two hours.

U.S. 2008/0011222A1 also assumes that the macroscopic voids are caused by gas bubbles which arise during the melting of the polycrystalline semiconductor material in the quartz glass crucible. An improved melting process is accordingly proposed, starting with melting by means of a side heater. The melt is then heated further in the bottom region of the crucible, which drives the melt movement and is thereby intended to lead to the degassing of the melt.

It has been found, however, that the occurrence of voids cannot be completely avoided by means of the described methods for carrying out the melting phase.

In accordance with U.S. Pat. No. 6,340,390 B1 the pressure in the chamber of the crystal pulling installation during crystal pulling is kept below 95 mbar and below the pressure prevailing during the melting phase. The low pressure during crystal pulling is intended to lead to continuous degassing of the melt and thus to avoidance of the incorporation of gas bubbles into the growing single crystal. However, the pressure is an important parameter for the entire crystal quality. By way of example, the oxygen content of the single crystal and, consequently, the precipitation capability and thus the gettering capability are altered. Reducing the macroscopic voids by correspondingly setting the pressure is therefore associated with disadvantages. Moreover, the effect described is not always obtained in practice.

SUMMARY OF THE INVENTION

An object of the invention was to further reduce the frequency of macroscopic voids in silicon single crystals without influencing the other crystal properties. These and other objects are achieved by means of a method for pulling a single crystal composed of silicon from a melt contained in a crucible, wherein the single crystal, during pulling, is surrounded by a heat shield, the lower end of which is at a distance h from the surface of the melt, wherein a gas flows downward in the region between the single crystal and the heat shield, outward between the lower end of the heat shield and the melt and then upward again in the region outside the heat shield, wherein the internal diameter DHS of the heat shield at the lower end thereof is at least 55 mm greater than the diameter DSC of the single crystal, and wherein the radial width BHSU of the heat shield at the lower end thereof is not more than 20% of the diameter of the single crystal.

DETAILED DESCRIPTION OF THE PREFERRED EMBODIMENTS

Figure 1:
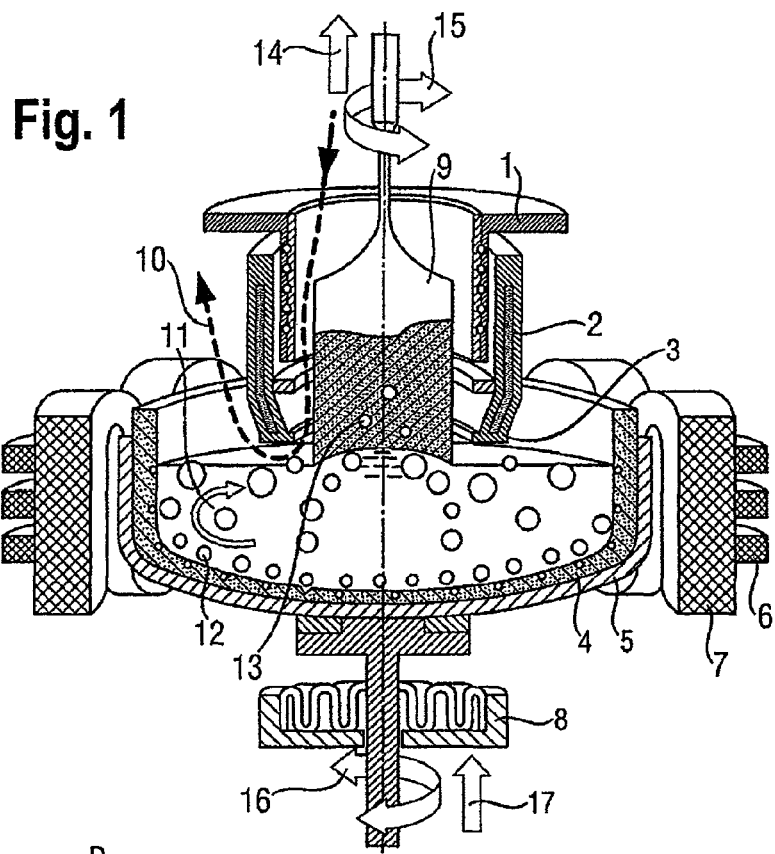
FIG. 1 shows the schematic construction of one embodiment of a crystal pulling installation which can be used for the method according to the invention.

FIG. 1 schematically shows a crystal pulling installation in accordance with the prior art during the crystal pulling process. A crucible 4, generally composed of quartz glass, contains the silicon melt 11. The crucible 4 is stabilized by a supporting crucible 5 and is heated either by side heaters 7 or by bottom heaters 8 or by both. The silicon single crystal 9 is pulled upward from the melt 11 at a predetermined rate (pulling rate, illustrated by arrow 14) with rotation (arrow 15), wherein the crucible 4 is likewise rotated (arrow 16) and is slowly moved along upward (arrow 17), for the purpose of keeping the position of the melt surface constant. Crucible 4 and single crystal 9 can be caused to effect rotation in the same direction or in opposite directions about the common axis of rotation. The convection in the melt can optionally be influenced by a magnetic field generated by electromagnets 6. The convection in the melt is indicated by an arrow.

The solidifying single crystal 9 is surrounded by a generally rotationally symmetrical heat shield 2, which can comprise an active cooling system 1. Heat shield 2 and, if appropriate, cooling system 1 are generally arranged rotationally symmetrically with respect to the axis of rotation of the single crystal 9. The heat shield generally has a height (when measured in a vertical direction) in the range of 200 to 400 mm.

The entire arrangement is situated in a sealed chamber (not illustrated) through which a gas is continuously passed. The gas is generally an inert gas, usually a noble gas such as argon, for example. The gas is fed to the chamber in such a way that the flow 10 of the gas flows downward in the direction of the melt 11 between the single crystal 9 and the heat shield 2, then between the melt 11 and the lower end 3 of the heat shield 2 into the region outside the heat shield 2 and, finally, in the region outside the heat shield 2 (at the inner edge of the crucible 4), upward again, where it is discharged from the chamber.

Gas bubbles 12 can arise at the inner wall of the crucible 4 that is wetted by the melt 11, which gas bubbles can be transported by the convection of the melt 11 to the surface of the melt 11 and to the crystallization front. In the latter case, they are incorporated as voids 13 into the single crystal 9.

The inventors have ascertained that, in order to avoid macroscopic voids in silicon single crystals, it is not sufficient to modify the melting phase of the crystal pulling process. Rather, gas bubbles 12 also arise during the entire pulling process at that wall of the quartz glass crucible 4 which is in contact with the silicon melt 11.

The silicon melt 11 attacks the wetted wall of the quartz glass crucible 4 which leads to the corrosion of the quartz glass crucible 4. Gaseous silicon monoxide (SiO) is formed during the reaction, i.e. gas bubbles 12 arise. The vapor pressure of SiO at a temperature of 1450° C. is approximately 13 mbar. As a result of the corrosion of the quartz glass crucible 4, it can also happen that the gas inclusions already present in the quartz glass crucible 4 are opened, which likewise leads to the formation of gas bubbles 12. The gas bubbles 12 are transported by the convection of the melt 11 as far as the free surface of the melt 11, where a large portion of the gas bubbles 12 emerges into the atmosphere. SiO deposits in pulverulent form on cooled parts of the installation and/or the exhaust gas system. However, a portion of the gas bubbles 12 passes to the crystallization front as a result of the convection in the melt 11 and is incorporated into the growing single crystal 9, whereby the macroscopic voids 13 described above arise.

In this case, it should be noted that, in the case of small bubbles having a diameter of up to 100 μm (which, on the other hand, should dissolve more rapidly), the buoyancy is low. Therefore, they are driven to the melt surface only at low buoyancy speeds (less than 10 cm/s).

As described above, an alteration of the flow conditions in the melt affects not only the transport of gas bubbles to the crystallization front, but also the transport of dissolved substances such as oxygen, for example, which likewise passes into the melt from the quartz glass crucible as a result of the corrosion and is incorporated into the growing single crystal. In general, an alteration of the oxygen content of the silicon or other crystal properties is undesirable, with the result that the flow conditions in the melt cannot be altered arbitrarily in order to avoid gas inclusions in the single crystal.

On the other hand, the inventors recognized that, in the cases mentioned above, the gas bubbles are only produced during crystal pulling and that the melt flows which bring about the transport to the solidifying crystal are of very great importance. The inventors then found a way to influence the transport of the gas bubbles to the crystallization front largely independently of the oxygen transport in the melt.

Figure 2:
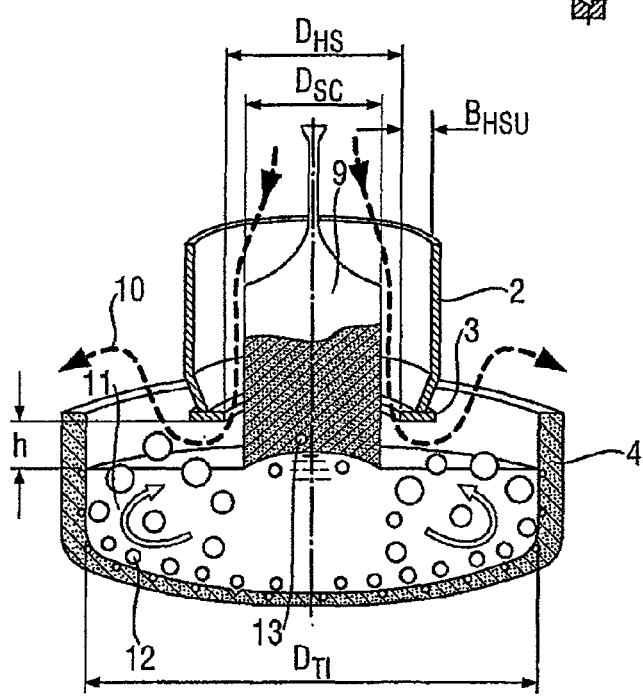
FIG. 2 shows a schematic arrangement for pulling a single crystal and illustrates the geometrical variables which play a part in the context of the invention.

The inventors have ascertained that, through a suitable choice of the dimensions of the lower region of the heat shield 2 (FIG. 2), it is possible to influence the flow conditions in a targeted manner in the region of the melt 11 near the surface. By contrast, the flows internally within the melt 11 that are important for the crystal quality are not altered.

According to the invention, the internal diameter $D_{HS}$ of the heat shield 2 at the lower end 3 thereof is at least 55 mm greater than the diameter $D_{SC}$ of the single crystal 9. Moreover, the radial width $B_{HSU}$ of the heat shield 2 at the lower end 3 thereof is not more than 20% of the diameter $D_{SC}$ of the single crystal 9. Under these conditions it is possible largely to suppress the incorporation of gas bubbles into the growing single crystal 9, without altering the other crystal properties. If the internal diameter $D_{HS}$ is chosen to be smaller or the radial width $B_{HSU}$ larger, voids are incorporated into the growing single crystal 9 to an increased extent. Preferably, the internal diameter $D_{HS}$ of the heat shield 2 is at least 100 mm less than the internal diameter $D_{TT}$ of the crucible 4. More preferably, the internal diameter $D_{HS}$ of the heat shield 2 at the lower end 3 thereof is greater than the diameter $D_{SC}$ of the single crystal 9 by at least 55 mm and not more than 110 mm. The radial width $B_{HSU}$ of the heat shield 2 at the lower end 3 thereof is downwardly limited only by the required material thickness of the heat shield, which, in general, cannot be less than 2 mm. The height of the heat shield is preferably in the range of between 200 and 400 mm.

It should be pointed out that the diameter $D_{SC}$ of the single crystal 9 is the actual diameter of the growing single crystal. This is several millimeters larger than the nominal diameter, i.e. the diameter of the semiconductor wafers that are later to be produced from this single crystal.

In contrast to most of the methods proposed in the prior art for reducing the incorporation of gas bubbles, the present invention takes effect not only before the beginning of the actual crystal pulling process (e.g. during the melting of the polycrystalline silicon), but during the entire pulling process and, in particular, also during the pulling of the cylindrical crystal part that is later sliced into wafers that are used for the production of electronic components.

The specific geometry of the heat shield essentially alters the gas flow over the melt and thus the temperature at the surface of the melt. The flow conditions at the surface of the melt thereby change in such a way that the transport of the harmful gas bubbles to the solidifying crystal is suppressed.

The geometry of the heat shield according to the invention, as described, directly affects the flow conditions of the gas over the melt and thus indirectly affects the temperature and convection conditions in the melt. It has been found that the best results are achieved if the flow rate of the gas and the pressure prevailing in the chamber are also chosen suitably. In particular, it is preferred for the quotient of the flow rate of the gas and the pressure prevailing in the chamber to be in the range of 20 to 500 (l/h)/mbar; a range of 20 to 50 (l/h)/mbar is particularly preferred. Taking account of the aforementioned ratio, the flow rate of the gas can be 500 to 8000 l/h and the pressure in the chamber can be 10 to 80 mbar.

Furthermore, it is preferred (FIG. 2) for the distance h between the lower end 3 of the heat shield 2 and the surface of the silicon melt 11 to be in the range of 10 to 40 mm.

By means of simulation calculations it was possible to determine that comparatively low flow velocities of the gas over the melt are achieved by means of the geometry according to the invention of the lower end of the heat shield and also by means of the ranges specified above for pressure, gas flow rate and distance between melt and heat shield. The maximum value of the flow velocity of the gas should preferably not exceed 30 m/s.

The method according to the invention can be used particularly advantageously if crucible and single crystal rotate in opposite directions about a common axis during crystal pulling, and if the rotational speed of the crucible is 0.25 to 25 revolutions per minute. The rotational speed of the single crystal is preferably in the range of 1 to 25 revolutions per minute but has no significant influence on the success of the method according to the invention. The crystal travel (pulling rate) is preferably in the range of 0.4 to 2.0 mm/min and is likewise of secondary importance for the method according to the invention.

The diameter $D_{TT}$ of the crucible 4 (FIG. 2) is preferably two to four times as large as the diameter $D_{SC}$ of the single crystal 9.

The method according to the invention permits the production of silicon single crystals which are substantially free of macroscopic voids or which at least contain significantly fewer voids of this type than single crystals pulled in accordance with the prior art.

The greatest problems were previously posed by single crystals having high dopant concentrations. The frequency of the occurrence of macroscopic voids increases, moreover, as the crystal diameter increases. In the case of highly doped silicon single crystals, the voids typically have diameters in the micrometer range (approximately 10-100 µm). The dopant concentration of the affected crystals is $1·10^{17}$ to $1·10^{20}$ cm$^{-3}$ (atoms per cubic centimeter). In the case of n-type doping, antimony, arsenic or red phosphorus is preferably used as a dopant. The typical dopant concentrations are in the range of $1·10^{17}$ to $5·10^{18}$ cm$^{-3}$ in the case of antimony, in the range of $5·10^{18}$ to $5·10^{19}$ cm$^{-3}$ in the case of arsenic and in the range of $5·10^{19}$ to $5·10^{20}$ cm$^{-3}$ in the case of phosphorus.

Quartz glass crucibles having an inner layer which is coated with a barium compound, for example barium carbonate, are particularly corrosion-resistant with respect to the highly doped silicon melt. In order to obtain a high dislocation-free crystal yield, therefore, exclusively crucibles of this type are used for the production of highly doped single crystals. However, it is precisely in the case of these crucibles that gas bubble inclusions occur particularly frequently, such that for example more than every thousandth wafer composed of single crystals highly doped (n++) with arsenic and having a diameter of 150 mm previously had a macroscopic void. This corresponds to a concentration of macroscopic voids of more than 80 m$^{-3}$. The method according to the invention significantly reduces the frequency of the occurrence of macroscopic voids in single crystals of this type.

The invention therefore also relates to a single crystal composed of silicon having a diameter of at least 100 mm, a crystal orientation (100) or (111), a dopant concentration of an element of the third or fifth main group of the periodic system of $1·10^{17}$ to $1·10^{20}$ cm$^{-3}$ and an oxygen concentration of $4·10^{17}$ to $9·10^{17}$ cm$^{-3}$, wherein the concentration of voids having a diameter of at least 50 µm in the single crystal is not more than 50 m$^{-3}$.

The dopants are preferably antimony, arsenic or phosphorus, antimony and arsenic being particularly preferred.

The concentration of the macroscopic voids, i.e. of the voids having a diameter of 50 µm or more (up to approximately 1 mm), can be determined by visual inspection of the silicon wafers produced from the single crystals in a conventional manner. If the number of silicon wafers examined is sufficiently large, for example 50,000 or more, the underlying density of the macroscopic voids in the single crystal can be reliably determined from the statistics.

EXAMPLES AND COMPARATIVE EXAMPLES

Far more than 100 silicon single crystals having the orientation (111) and (100) with nominal diameters of 100, 125 and 150 mm were pulled by means of the crucible pulling method according to Czochralski. The doping was effected using arsenic (As) or antimony (Sb). The data for the actual diameter ($D_{SC}$) of the pulled single crystal, crystal orientation and doping (dopant and concentration $c_{Dop}$ of the dopant) are indicated in the table below. The dopant concentration varies on account of the segregation within a single crystal in an axial direction. The concentration $c_{Dop}$ indicated is the maximum dopant concentration that occurs in each of the single crystals.

Quartz glass crucibles 4 coated with barium carbonate ($BaCO_3$) on the inner side were used for the experiments. The internal diameter $D_{TT}$ of the crucible 4 is likewise indicated in the table. The starting material used was polycrystalline ultrapure silicon fragments, which were placed manually into the crucibles.

A crystal pulling installation corresponding to the illustration of FIG. 1 was used. The pulling process was carried out without a magnetic field. The heating was effected exclusively by the side heaters 7. A heat shield 2 composed of molybdenum without a cooler 1 was used, the dimensions of the heat shield being indicated in the table. In this case, $D_{HS}$ denotes the internal diameter of the heat shield 2 at the lower end 3 thereof, and $B_{HSU}$ denotes the radial width of the heat shield 2 at the lower end 3 thereof.

In addition to the variables already described above, the table below also contains the maximum permissible width $B_{HSU,max}$ according to the invention for the respective actual crystal diameter $D_{SC}$ (corresponding to 20% of the actual diameter $D_{SC}$ of the growing single crystal) and also the minimum permissible internal diameter $D_{HS,min}$ according to the invention of the heat shield (55 mm more than the actual diameter $D_{SC}$ of the growing single crystal), in each case at the lower end of the heat shield.

The last column contains the concentration $c_{PH}$ of voids having a diameter of at least 50 µm in the pulled single crystals. For this purpose, in each case more than 50,000 silicon wafers were taken from the pulled single crystals and examined by means of visual inspection.

| Example | $D_{SC}$ [mm] | Orientation | Dopant | $c_{Dop}$ [$10^{18}$ at/cm$^3$] | $B_{HSU}$ [mm] | $B_{HSU,max}$ [mm] | $D_{HS}$ [mm] | $D_{HS,min}$ [mm] | $c_{PH}$ [m$^{-3}$] |
|---|---|---|---|---|---|---|---|---|---|
| 1a | 104 | (111) | Sb | 0.8 | 22 | 20.8 | 140 | 159 | 56 |
| 1b | 104 | (111) | Sb | 0.8 | 20 | 20.8 | 180 | 159 | 25 |
| 2a | 104 | (111) | As | 7.8 | 22 | 20.8 | 140 | 159 | 78 |
| 2b | 104 | (111) | As | 7.8 | 20 | 20.8 | 180 | 159 | 49 |
| 3a | 129 | (111) | As | 7.8 | 20 | 25.8 | 180 | 184 | 81 |
| 3b | 129 | (111) | As | 7.8 | 15 | 25.8 | 210 | 184 | 16 |
| 4a | 154 | (100) | As | 7.8 | 35 | 30.8 | 200 | 209 | 91 |
| 4b | 154 | (100) | As | 7.8 | 15 | 30.8 | 210 | 209 | 49 |

In the case of comparative examples 1a, 2a, 3a and 4a, the dimensions of the heat shield which are relevant to the invention do not correspond to the stipulations according to the invention. Thus, in comparative examples 1a, 2a and 4a, the radial width $B_{HSU}$ of the heat shield at the lower end thereof is greater than the maximum permissible value $B_{HSU,max}$ according to the invention. Moreover, in all the comparative examples, the internal diameter $D_{HS}$ of the heat shield at the lower end thereof is less than the minimum permissible value of the internal diameter $D_{HS,min}$ according to the invention. Apart from the two geometrical parameters of the heat shield that are presented in the table, the associated pairs of comparative examples and examples (1a and 1b; 2a and 2b; 3a and 3b; 4a and 4b) were carried out under completely identical conditions.

By contrast, in the case of examples 1b, 2b, 3b and 4b, all the stipulations according to the invention are fulfilled. This leads in each individual case to a significant decrease in the occurrence of macroscopic voids. In particular the maximum value for the occurrence of macroscopic voids as defined in claim 9 is undershot in all the examples. This is not the case in the comparative examples. Consequently, it is clearly evident that carrying out the pulling method according to the invention leads to a significantly reduced frequency of macroscopic voids which lies in the range according to the invention.

What is claimed is:

1. A single crystal composed of silicon having a diameter of at least 100 mm, a crystal orientation, a dopant concentration of an element of the third or fifth main group of the periodic system of $1 \cdot 10^{17}$ to $1 \cdot 10^{20}$ cm$^{-3}$ and an oxygen concentration of $4 \cdot 10^{17}$ to $9 \cdot 10^{17}$ cm$^{-3}$, wherein the concentration of macroscopic voids having a diameter of at least 50 μm in the single crystal is not more than 50 m$^{-3}$.

* * * * *